United States Patent [19]

Karasawa et al.

[11] Patent Number: 5,086,270
[45] Date of Patent: Feb. 4, 1992

[54] PROBE APPARATUS

[75] Inventors: Wataru Karasawa, Yokohama; Taketoshi Itoyama, Tokorozawa; Itaru Takao, Yamanashi; Tadashi Obikane, Kofu; Hisashi Koike, Yamanashi, all of Japan

[73] Assignee: Tokyo Electron Limited, Tokyo, Japan

[21] Appl. No.: 634,814

[22] Filed: Dec. 31, 1990

Related U.S. Application Data

[63] Continuation of Ser. No. 359,579, Jun. 1, 1989, abandoned.

[30] Foreign Application Priority Data

Jul. 8, 1988 [JP] Japan .................. 63-171570

[51] Int. Cl.$^5$ ........................... G01R 31/26
[52] U.S. Cl. ............... 324/158 P; 324/158 F; 118/712; 374/45; 414/222
[58] Field of Search ........... 73/866.5, 865.8, 865.6, 73/865.9, 866.4; 324/158 F, 158 P, 158 R; 374/45, 57; D10/46; 432/259; 219/385, 405, 411; 358/101, 107, 96, 108; 382/8; 118/712, 75; 414/222; 401/195

[56] References Cited

U.S. PATENT DOCUMENTS

| | | | |
|---|---|---|---|
| 2,311,942 | 2/1943 | Hagenmeyer | 432/259 |
| 3,572,400 | 3/1971 | Casner et al. | 118/712 X |
| 3,590,372 | 6/1971 | DeSantis et al. | 324/158 FX |
| 3,662,881 | 5/1972 | Fineran | 414/222 X |
| 3,991,302 | 11/1976 | Danner | 324/73 PC |
| 4,056,716 | 11/1977 | Baxter et al. | 324/73 PC |
| 4,097,226 | 6/1978 | Erikson | 219/405 |
| 4,101,759 | 7/1978 | Anthony | 219/411 |
| 4,453,406 | 6/1984 | Spitzer | 73/866.5 |
| 4,454,585 | 6/1984 | Ele | 73/587 X |
| 4,468,260 | 8/1984 | Hiramoto | 219/405 |
| 4,500,003 | 2/1985 | Cedrone | 324/158 FX |
| 4,507,605 | 3/1985 | Geisel | 324/536 |
| 4,535,228 | 8/1985 | Mimura | 219/411 |
| 4,539,695 | 9/1985 | La Fiandra | 414/222 X |
| 4,545,327 | 10/1985 | Campbell | 219/411 |
| 4,550,245 | 10/1985 | Arai | 219/411 |
| 4,567,432 | 1/1986 | Buol et al. | 324/158 F |
| 4,618,938 | 10/1986 | Sandland et al. | 382/8 X |

(List continued a next page.)

FOREIGN PATENT DOCUMENTS

| | | | |
|---|---|---|---|
| 0030964 | 2/1982 | Japan | 324/158 F |
| 162441 | 10/1982 | Japan . | |
| 0172562 | 10/1983 | Japan | 324/158 F |
| 60-41045 | 3/1985 | Japan . | |
| 168236 | 7/1986 | Japan . | |
| 244441 | 10/1986 | Japan | 414/222 |
| 4334 | 1/1987 | Japan | 324/158 P |
| 52941 | 3/1987 | Japan | 324/158 P |
| 136041 | 6/1987 | Japan | 324/158 P |
| 226936 | 9/1988 | Japan . | |
| 240039 | 10/1988 | Japan . | |
| 244637 | 10/1988 | Japan . | |
| 292639 | 11/1988 | Japan | 324/158 P |
| 118794 | 5/1989 | Japan | 73/866.5 |
| 87/06561 | 11/1987 | PCT Int'l Appl. | 414/222 |
| 1310672 | 5/1987 | U.S.S.R. | 73/866.5 |

OTHER PUBLICATIONS

*Patent Abstracts of Japan*: ABS GRPN. E712; ABS vol. 13, No. 51 ABS pub. date Feb. 6, 1989: Abstract of Japanese pat. no. 63-244637 pub. Oct. 12, 1988.

*Patent Abstracts of Japan*: GRP No. E711; vol. 13, No. 46, ABS pub. date Feb. 2, 1989; Abstract of Japanese pat. no. 63-240039 pub. 10/5/1988.

(List continued on next page.)

*Primary Examiner*—Tom Noland
*Attorney, Agent, or Firm*—Oblon, Spivak, McClelland, Maier & Neustadt

[57] ABSTRACT

A probe apparatus having a measuring section with a first system for electrically measuring an object. A loader section has a second system for carrying objects to the measuring section and a marking section has a third system for marking objects. These sections are independent of each other so that a vibration occurring in one section is not transmitted to the other sections.

8 Claims, 4 Drawing Sheets

U.S. PATENT DOCUMENTS

| | | | |
|---|---|---|---|
| 4,639,187 | 1/1987 | Maruyama et al. | 324/158 FX |
| 4,643,629 | 2/1987 | Takahashi et al. | 444/222 X |
| 4,649,261 | 3/1987 | Sheets | 219/411 |
| 4,658,646 | 4/1987 | Bell et al. | 73/866.5 X |
| 4,691,831 | 9/1987 | Suzuki et al. | 324/158 FX |
| 4,729,246 | 3/1988 | Melgaard et al. | 73/865.6 |
| 4,755,654 | 7/1988 | Crowley | 219/411 |
| 4,755,747 | 7/1988 | Sato | 324/158 F |
| 4,758,782 | 7/1988 | Kobayashi | 382/8 X |
| 4,786,867 | 11/1988 | Yamatsu | 324/158 F |
| 4,812,750 | 3/1989 | Keel et al. | 324/158 RX |
| 4,812,901 | 3/1989 | Karasawa | 382/8 X |
| 4,852,415 | 8/1989 | Bogatzki et al. | 73/865.8 |
| 4,875,005 | 10/1989 | Terada et al. | 324/158 F |
| 4,888,549 | 12/1989 | Wilson et al. | 324/158 F |
| 4,896,869 | 1/1990 | Takekoshi et al. | 269/309 X |
| 4,926,118 | 5/1990 | O'Connor et al. | 73/805.6 X |
| 4,992,729 | 2/1991 | Nadeau | 324/158 P |

OTHER PUBLICATIONS

*Patent Abstracts of Japan*: GRP E151, vol. 7, No. 4, ABS pub. date Jan. 8, 1983 Abstract of Japanese Patent No. 52-162441 pub. Oct. 6, 1982 by Aida.

*Patent Aabstracts of Japan*: GRP E464, vol. 10, No. 376; ABS pub. date Dec. 13, 1986 Abstract of Japanese Pat. No. 61-168236 Pub. Jul. 29, 1986.

*Patent Abstracts of Japan*: GRP E705, vol. 13, No. 23, ABS pub. date Jan. 19, 1989; Abstract of Jap. Pat. No. 63-226936 pub. Sep. 21, 1988 resulting from application No. 62-60581.

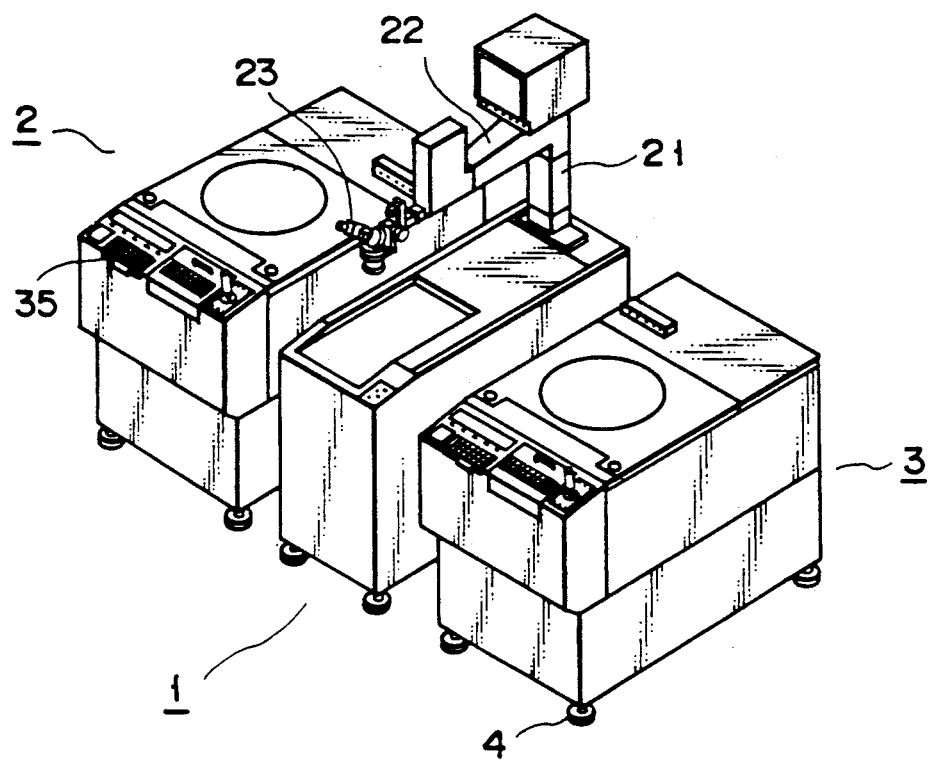
F I G. 1

PROBE APPARATUS

This application is a continuation of application Ser. No. 07/359,579, filed on June 1, 1989, now abandoned.

BACKGROUND OF THE INVENTION

1. Field of the Invention

The present invention relates to a probe apparatus including a loader section and plural measuring sections capable of being freely combined with the loader section.

2. Prior Art

Various kinds of ICs and LSIs are produced in the semiconductors manufacturing factories, for example, to meet technical developments. The semiconductors manufacturing apparatus installed in the clean room at the semiconductors manufacturing factory is intended to meet one of the memory ICs, gate array ICs and the like manufacturing lines. In other words, the semiconductors manufacturing apparatus differs depending upon the kind of ICs produced, and the probe apparatus is also arranged in every manufacturing line. However, the production of each of the manufacturing lines often changes largely because products on one of these manufacturing lines are sometimes urgently needed, and the probe apparatus must satisfy this urgent need. The clean room is an extremely high cost arrangement. Therefore, it must be arranged so that the smallest number of the probe apparatuses are combined with one another to meet the production change without enlarging the floor area of the clean room and lowering the process capacity of the apparatuses. However, the conventional probe apparatus comprises a loader section for housing a plurality of objects to be measured and having a system for carrying the objects, and a measure section for measuring the objects. These loader and measure sections are paired to form the probe apparatus. When wafers of one kind must be quickly measured while concurrently measuring wafers of the other kind, therefore, there is nothing to do but wait until the measurement of 25 pieces of wafers of the other kind is finished by one probe apparatus, since a cassette which is carried to the probe apparatus contains 25 pieces of wafers as a unit. Or it must be arranged so that several pieces of wafers of the other kind are picked up from the cassette and that they are allotted to plural probe apparatuses to measure them. This requires many hands.

In order to solve this problem, a wafer supply means is used including loader sections or wafers supply and housing systems arranged right and left and before and behind a semiconductor wafer prober (preliminarily-opened Japanese Utility Model Application Sho 60-41045) and a probe apparatus including plural measurement stage systems to measure wafers, located relative to a loader section (preliminarily-opened Japanese Patent Application Sho 61-168236).

While a wafer is being measured at a measuring section, however, a next wafer must be carried to the other measuring section at the loader section in the above case. Therefore, vibration caused when the next wafer was carried at the loader section was transmitted to the wafer which was under measurement, thereby making it impossible to make accurate measurement of the water.

When plural loader and measuring sections were fixed in an independent box, the probe apparatus became large in size, thereby making it impossible for the large-sized apparatus to be quickly moved and rearranged in the clean room.

As shown in FIG. 2, the wafer was marked by a marking needle of the marking means through a hole in the center of the probe needle lines immediately after its measurement and according to its measuring results. According to this method, however, it sometimes happened that the marking means contacted and broke the probe needle and that IC chips on the wafer were damaged.

Although semiconductor chips were previously measured under normal temperature (25° C.), it is currently a requirement that their electric characteristics be measured under high and, low temperatures.

SUMMARY OF THE INVENTION

The object of the present invention is to provide a probe apparatus comprising an independent member of loader section, and at least two independent members of measuring sections located relative to the member of loader section, or an independent member supporting a loader section and a measuring section therein and at least an independent member of measuring section located relative to the member of loader and measuring sections, said probe apparatus being capable of having such a capacity which corresponds to that of two conventional probe apparatuses, measuring a wafer while marking another wafer, measuring the characteristics of the wafer at different temperatures and quickly meeting any required needs.

BRIEF DESCRIPTION OF THE DRAWINGS

FIG. 1 is a perspective view showing a probe apparatus according to one embodiment of the present invention;

DETAILED DESCRIPTION OF THE PREFERRED EMBODIMENT

An embodiment of the semiconductor wafer prober to which the present invention is applied will be described with reference to the accompanying drawings.

This wafer prober comprises loader section 1 formed by a single independent box or a supporting member, and first and second measuring sections 2 and 3 each having a single independent box or frame which constitutes an independent member, first and second measuring sections 2 and 3 are arranged on the left and right sides of loader section 1.

As shown in FIG. 1, loader section 1 is an independent box, 1000 mm long, 380 mm wide and 800 mm high, and casters 4 are attached to the underside of this box at four corners thereof to carry it to any position desired. When stoppers are attached to these casters 4, respectively, the box can be carried to any position desired and then fixed there.

Side plates are detachably attached to both sides of the box of loader section 1, each to one side using eight bolts screwed at four corners and between adjacent corners. When two boxes of first and second measuring sections 2 and 3 are to be used on both sides of the box of loader section 1, therefore, the side plates on both sides of the box of loader section 1 can be easily detached.

Figure 2:
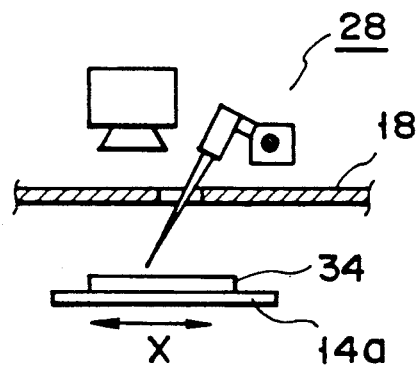
FIG. 2 is a view schematically showing a conventional marking device.
Figure 3:
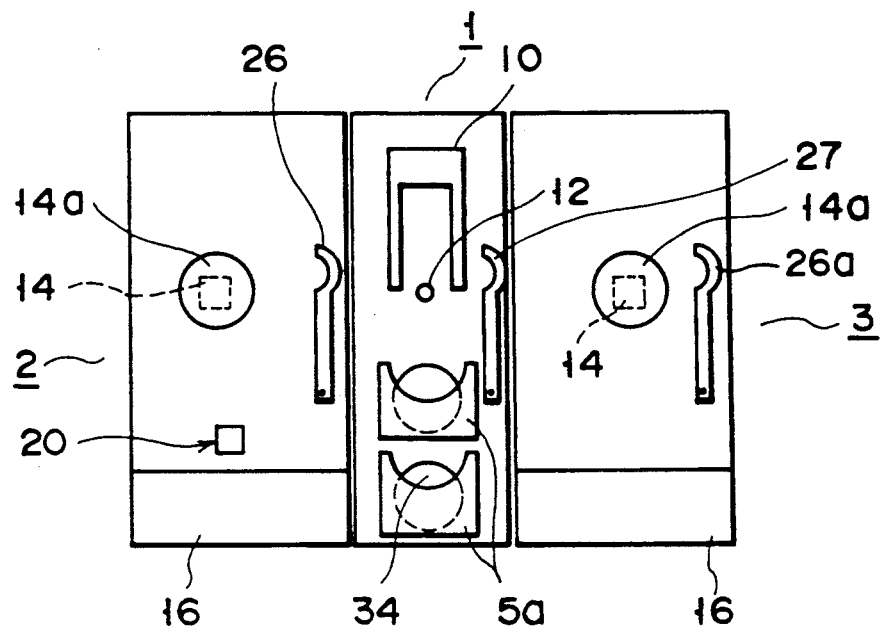
FIG. 3 is a plan view intended to explain the probe apparatus shown in FIG. 1.
Figure 4:
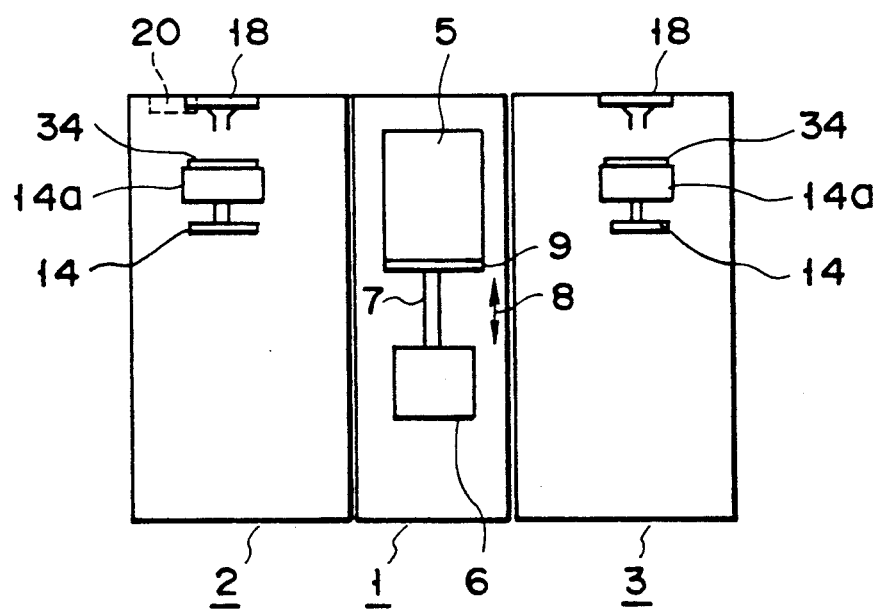
FIG. 4 is a front plan view showing the probe apparatus.
Figure 5:
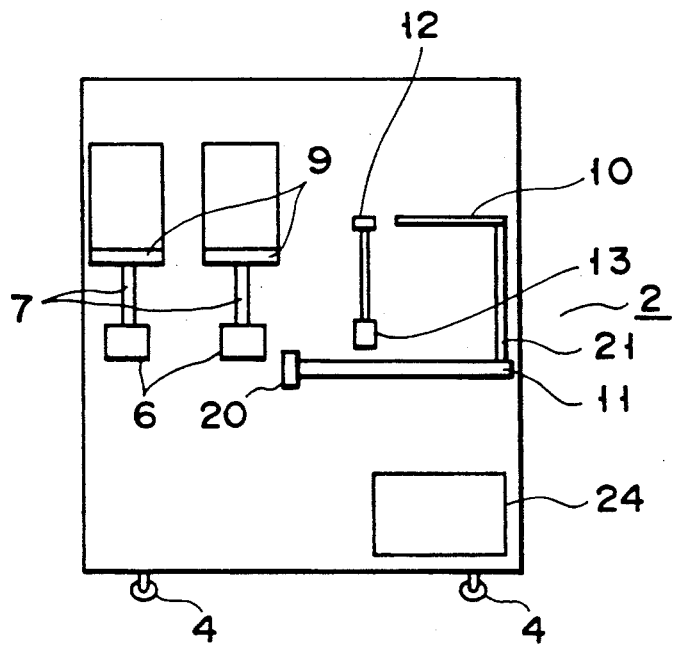
FIG. 5 is a side plan view showing the probe apparatus.

FIGS. 3 and 4 are plan and front views schematically showing a probe apparatus comprising loader section 1 and measuring sections 2 and 3 arranged on both sides of loader section 1, FIG. 3 showing the probe apparatus with its top removed and FIG. 4 showing it with its front side removed. Loader section 1 includes portions 5 for housing wafer cassettes 5a at the front side therein. Motor 6 is connected to each of the cassette housing portions 5 through a rotatable guide rod 7 and cassette mount 9 is attached to the top of guide rod 7. When guide rod 7 is rotated by motor 6, cassette mount 9 is moved up and down to move the wafer cassette thereon up and down in directions shown by arrows 8. Cassette 5a contains 25 pieces of wafers 34 at a certain interval and a plurality of semiconductor chips are regularly formed on each of wafers 34 which are to be measured. Two cassettes 5a can be mounted at cassette housing portion 5.

Support rod 21 is erected from horizontal rotary shaft 11 and vacuum suction pincette 10 is attached to the top of support rod 21, so that pincette 10 can be horizontally slid to pick up and set wafer 34 either from or in cassette 5a. Prealignment stage 12 on which wafer 34 can be mounted is arranged between vacuum suction pincette 10 and cassette housing portions 5 and it is connected to motor 20 to move in directions Z and $\theta$. Slide-rotatable arm 27 for carrying wafer 34 from prealignment stage 12 to a measuring stage at the measuring section is arranged in the center but on the right side of loader section 1. Arm 27 is connected to motor 13$\theta$ to horizontally rotate by 360°. Column 21 is erected from the back of the top of the loader section box and arm 22 is attached to column 21 to rotate round column 21 by 360°. Microscope 23 through which semiconductor chips can be viewed enlarged is attached to the top of arm 22 and it can be moved up and down over 200 mm, for example. Since it is arranged on loader section 1, microscope 23 which was conventionally needed for every probe apparatus can cover two probe apparatuses, thereby reducing the cost. CPU is housed in loader section 1 and wired to a keyboard (not shown) detachably attached on the top of the loader section box to control loader section 1.

When first measuring section 2 becomes out of order or it is made inoperative by some fault, measurement is switched automatically to second/measuring section 3 by CPU in loader section 1. When second measuring section 3 becomes inoperative, measurement is similarly switched to first measuring section 2. Input to CPU in loader section 1 is made by operating the keyboard on the top of the loader section box. A power source portion is located on the bottom of the loader section box to enable current to be supplied to first and second measuring sections 2 and 3.

Each of first and second measuring sections 2 and 3 has the same arrangement and it is a box independent of the other. They can be located on either side, left or right, of loader section 1. First measuring section 2 is an independent box, 1000 mm long, 620 mm wide and 800 mm high, and casters 4 are attached to the underside of first measuring section 2 at four corners thereof to carry it to any position desired. Stoppers are attached to casters 4, respectively, to fix first measuring section 2 at the position desired. Side plates are detachably attached to both sides of first measuring section 2, each to one side using eight bolts screwed at four corners, and between adjacent corners of the side plate. Measuring stage 14 in first measuring section 2 can be driven in directions X, Y, Z and $\theta$ by the well-known means and the range of measuring stage 14 driven particularly in directions X and Y can be made symmetrical right and left as well as before and behind the center of first measuring section 2. Loading arm 26 is added, as an auxiliary means, to vacuum-suck and carry, while rotating, wafer 34 on prealignment stage 12 to seat 14a on measuring stage 14. Arm 26 is located in the center but at the right side of the first measuring section box. Next wafer 34 is made ready on arm 26. An unloading arm (not shown), similar to arm 26, is arranged under arm 26. Same pair of arms 27 are located in the center but at the right side of loader section 1.

When the object to be measured is at the measuring position, a probe card is set opposite to measuring stage 14 and measurement of the object is carried by the well-known means. The operation of first measuring section 2 is controlled by CPU to which input is made through operating panel 35, as shown in FIG. 1. As described above, first and second measuring sections 2 and 3 are same in construction, and description on first measuring section 2 can also be applied to second measuring section 3. Since first and second measuring sections 2 and 3 are same in construction, as described above, vacuum suction arm 26a of second measuring section 3 can be used when another independent box is set beside the measuring section 3.

First measuring section 2 is located on the left side of loader section 1 while second measuring section 3 on the right side thereof, for example. Both side plates of loader section 1, the right side plate of first measuring section 2 and the left side plate of second measuring section 3 are previously removed in this case. When side plates are removed, a guide plate appears, traversing along the center line, on each of right and left sides of first and second measuring sections and guide pins project from each of the guide plates at a certain interval. Sleeve-like guide holes are arranged on both sides of loader section 1, corresponding to the guide pins on right and left side of first and second measuring sections 2 and 3. Loader section 1, first and second measuring sections 2 and 3 are positioned while inserting the guide pins into the guide holes. First and second measuring sections 2 and 3 and loader section 1 are then fixed one another by means of bolts. CPU in loader section 1 and those in first and second measuring sections 2 and 3 are connected one another and current is supplied from power source 24 in loader section 1 to first and second measuring section 2 and 3. When arranged like this, a next wafer can be loaded at loader section 1 while measuring the previous wafer at one measuring section. Even when the next wafer is loaded in this manner, the loading vibration cannot be transmitted to the measuring section, thereby enabling accurate measurement to be attained. In other words, accurate measurement can be attained while loading a next wafer.

One of measuring sections 2 and 3 is provided with marking area 20. Marks are added to those objects at this marking area 20 by mean of marking means 28 which are determined deficient on the basis of measuring results provided by measuring section 2 and 3. Marking area 20 is located at a position desired in first measuring section 2 in this case. The position of marking area 20 is not above probe card 18, as conventionally seen, but preferably independent of probe card 18 to be free from dust and the like created by the marking, for example.

Figure 6:
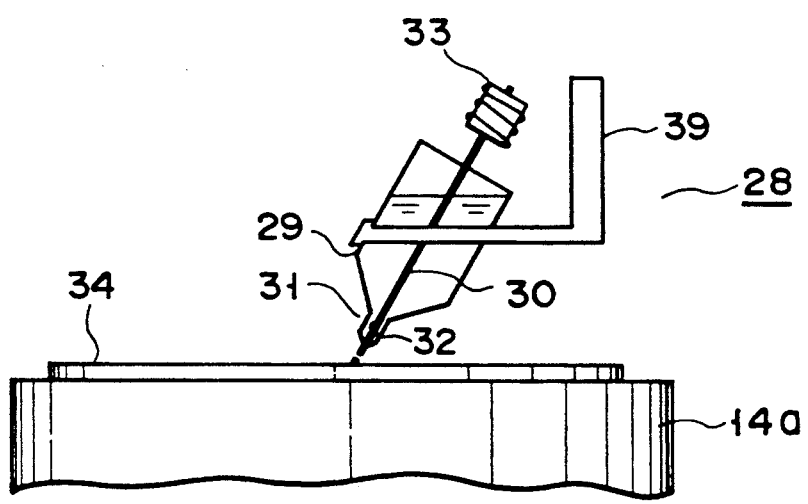
FIG. 6 is a side view schematically showing a marking device used for the probe apparatus according to the present invention.

In the case of marking means 28 of the ink type located at marking area 20 and shown in FIG. 6, ink is contained in ink container 29. Rod 30 for pushing out a predetermined amount of ink passes through ink container 29. Ink push-out portion 31 is formed at the front end of ink container 29. Ink push-out portion 31 is provided with ink push-out hole 32, through which ink push-out rod 30 can pass. The other end of rod 30 is passed through electromagnetic coil 33. Voltage of 60 V, for example, is applied, as a pulse of 35 ms, to electromagnetic coil 33, which is excited and ink push-out rod 30 is pushed down due to magnetic field thus created. When rod 30 is pushed down in this manner, the predetermined amount of ink is pushed out of ink container 29 to mark the object with ink thus pushed out. Marking means 28 is held by holder means 39, which is provided with an adjuster (not shown) to adjust the position of marking means 28.

Marking area 20 is located, as described above, at measuring section 2 and the whole of the probe means is controlled in operation and setting by a control means (not shown).

Cassette 5a in which 25 pieces of semiconductor wafers 34, same in kind, are seated is carried and placed on seat 9. Seat 9 is moved up and down in directions shown by arrows 8 to set first piece of wafer 34 to be measured at a predetermined height. Vacuum pincette 10 is slide-moved by rotary shaft 11 to place first wafer 34 on auxiliary alignment stage 12. First wafer 34 is vacuum-sucked by auxiliary alignment stage 12. Wafer 34 is then centered by a light-emitting and receiving sensor while being rotated, and auxiliary alignment of wafer 34 is carried out on the basis of the orientation flat. First wafer 34 is then carried onto mount 14a of measuring stage 14 of first measuring section 2 by means of arm 26. Mount 14a is moved to alignment area 16 by moving stage 15 (not shown). Wafer 34 is accurately aligned here on the basis of its scribed lines and patterns. Mount 14a is then lifted to a predetermined position. Probe needles of probe card 18 are thus contacted with electrode pads of IC chips formed on wafer 34. While being contacted with probe needles like this, electric characteristics of IC chips are measured by a tester (not shown). This contact measurement operation is carried out every IC chip on wafer 34 while moving mount 14a to contact the IC chip with probe needles one after another. Measuring results, good or deficient, of every IC chip are stored in memory system (not shown).

After first wafer 34 is carried to left measuring section 2 by arm 26, second wafer 34 is picked up from same cassette 5a and set on auxiliary alignment stage 12. Auxiliary alignment is applied to this second wafer 34. Second wafer 34 is then carried by means of arm 27 of loader section 1 to measuring stage 14 at measure section 3 different from measuring section 2 where first wafer 34 is being measured Second wafer 34 is measured at measuring section 3. After second wafer 34 is carried, third wafer 34 is auxiliarily aligned and then made ready on loading arm 26 of measuring section 2 where first wafer 34 is being measured. Similarly, fourth wafer 34 is made ready on loading arm 27 of loader section 1 while second wafer 34 is being measured at measuring section 3. When the measurement of first wafer 34 is finished, first wafer 34 is unloaded by unloading arm and seated at its original position in cassette 5a. At the same time, third wafer 34 which is ready on loading arm 26 is carried and measured Fifth wafer 34 is made ready on loading arm 26. Similarly, same operation is done at measuring section 3 where second wafer 34 is being measured. Semiconductor wafers 34 of the same kind seated in same cassette 5a are allotted to two measuring sections 2 and 3 and measured as described above.

A predetermined pieces of wafers 34 are measured in this manner at each of the measuring sections and marking is then applied exclusively to them at measuring section 2 where making area 20 is provided. Measuring operation is continuously carried out at other measuring section 3 during the marking at measuring section 2. Namely, 25 pieces of wafers 34 are seated in one cassette in this case. Time needed for the measuring process is shorter than that needed for the marking process. 20 of 25, pieces of wafers 34, for example, are measured at both of measuring section 2 and 3. Remaining 5 pieces of wafers 34 are then measured only at second measuring section 3, for example, while those wafers 34 which have been measured are under the marking process at first measuring section 2. When 25 pieces of wafers 34 are process in this manner, they can be measured and marked in a short time.

The marking process is carried out as follows: Wafer 34 which is in cassette 5a after it is measured is carried to prealignment stage 12 by vacuum pincette 10. After it is pre-aligned there, it is carried to mount 14a of first measuring section 2 by arm 26. After it is accurately aligned at alignment portion 16, the marking process is applied to it. This marking process is carried out responsive to instructions applied from the memory system which stores measuring results of each of wafers 34 measured. More specifically, mount 14a on which wafer 34 is placed is moved to marking area 20. Mount 14a is further moved to bring the IC chips, which is determined deficient, under ink push-out portion 31 of marking means 28. When the IC chip is at this position, pulse of 35 ms is applied to electromagnetic coil 33 of marking means 28, using voltage of 60V, for example. Ink push-out rod 30 thus pushes out ink through the ink push-out hole. The deficient IC chip can be marked with ink by marking means 28. This operation is repeated to mark all of the deficient IC chips on wafer 34 with ink. Wafer 34 whose marking is finished is then returned to its original position in cassette 5a and another wafer 34 which is measured is then marked responsive to instructions applied from the memory system. While the marking process is being carried out in this manner at first measuring section 2, remaining wafers 34 which are not measured yet are measured one after another at second measuring section 3. When these remaining wafers 34 are all measured and marked, the measuring of wafers 34 contained in one cassette 5a is finished.

The present invention is not limited to the above-described embodiment. The measuring operation of wafers may be carried out as follows: When the probe apparatus is same as the above-described embodiment, wafers 34 are allotted to first and second measuring sections 2 and 3 and measuring at these both measure sections. Wafers 34 which have been measured at second measuring section 3 are housed in cassette 5a. When wafer 34 is measured at first measure section 2 where the marking area is provided, the mount 14a on which the wafer 34 is mounted is moved to the marking area and the marking process is applied to wafer 34. This operating is repeated and when the number of wafers 34 which are not measured yet reaches a predetermined value, first measuring section 2 is used exclusively to carry out the marking process. Those wafers 34 which have been measured at second measuring section 3 are brought under the marking process at first measuring section 2, which is now used as only the marking means, according to instructions applied from the memory system. When the measuring and marking processed are carried out in this manner, the measuring operation of wafers 34 can be finished more quickly.

Although wafers 34 housed in one portion have been allotted to two measuring sections and measured at these two sections in the case of the above-described embodiment, the present invention is not limited to it. Three or more measuring sections may be provided and one of these measuring sections may be used only as the marking means in this case. Further, the cassette housing portion may be plural.

Although wafers 34 have been measured at first at two measuring sections and one of these two measuring sections has been started to serve as the marking means on the way of measuring wafers 34 in the above-described embodiment, the present invention is not limited to it. One of the measuring sections may be used from the start only as the marking means. It depends upon the relation of the wafer measuring time with the wafer marking time whether or not one of the measuring sections is used from the start only as the marking means and whether or not one of them is started to serve only as the marking means after both of them are used at first as the measuring means.

Only the marking means may be fixed in an independent box. In this case, the accurate marking can be achieved because vibration occurred in the other boxes isn't transmitted to the wafer which is under marking.

The marking means may not be of the ink type but it may be of the scratch type of scratching wafers by a diamond needle or the like. Or it may be of the laser type of melting the surface of wafers by laser beam.

The marking means may be arranged at same position as that of the probe card.

The object to be measured is not limited to semiconductor wafers. It may be liquid crystal display means (LCD) used for the television screen. It may not be limited to any specific matter.

Although the above-described probe measurement is once applied to a device (or chip), some of semiconductor wafers need to be measured twice or more by different testers. They are one chip microcomputer with a memory, EPROM and the like. When different testers are connected to first and second measuring sections, respectively, and one device is passed through both of the measuring sections in this case, measurement can be carried out with efficiency. In the case of these devices, their probe measurement is finished when they are subjected to tests conducted by both of the testers connected. When these wafers are to be measured, first test is conducted of one wafer at the first measuring section and its test result is stored. During this test, another wafer which is not measured yet is carried to the second measuring section and subjected to second test. Its test result is stored. Wafers are successively carried to each of the measuring sections in this manner and tested, storing their test results. Wafers which have been subjected to the first test are carried to the second measuring section except those which have been determined deficient by the first test, and the second test is applied to them. Similarly, wafers which have been subjected to the second test are carried to the first measuring section except those which have been determined deficient by the second test, and the first test is applied to them. Then, chips which have been determined deficient by either of the first or second test are marked at the marking area of the first measuring section. It may be arranged this time that second test results are stored together with first test results and that the marking is later conducted on the basis of the first and second test results stored.

The testers used for the first and second tests are different in the above-mentioned case, but even when same testers are used at the first and second measuring sections, there are cases where same wafer is twice measured changing its measuring conditions. They include these cases where high temperature test is conducted at the first measuring section while low temperature test at the second measuring section and where DC test is conducted at the first measuring section while AC test at the second measuring section, and so on.

There will be described a case where the present invention is applied to two or more temperature tests.

Figure 7:
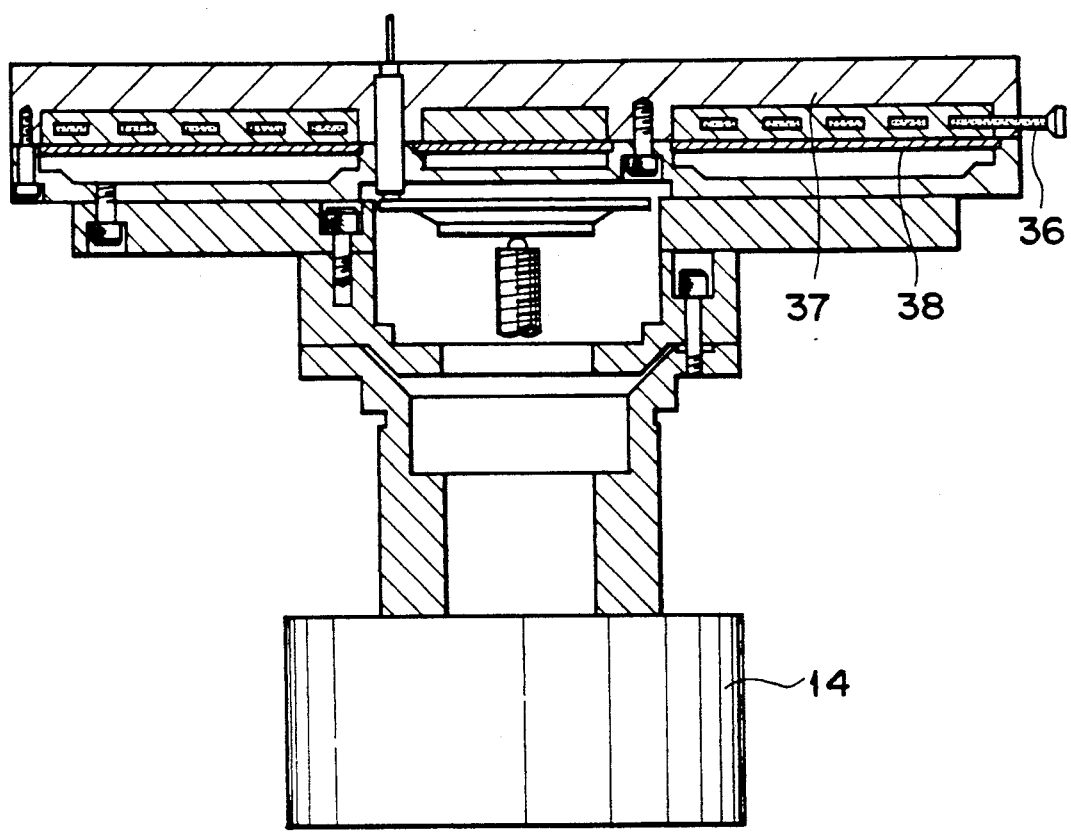
FIG. 7 is a sectional side view showing a wafer setting stage in which a means for raising and lowering temperature is housed.

The probe apparatus same as in the above-described embodiment is used. As shown in FIG. 7, mount 14a is provided with a means for heating wafer 34 to a predetermined temperature. The characteristic of this case resides in that mounts 14a of measuring stages 14 at first and second measuring sections 2 and 3 are set to have different temperatures and that wafer 34 is carried from mount 14a of a temperature to mount 14a of another temperature to keep its temperature at different values while being examined.

Temperature raising the lowering means must be arranged in mounts 14a to keep mounts 14a at predetermined temperatures as described above. Therefore, cooling jacket 36 is embedded contacting the whole underside of chuck top 37 (which is metal on the top of the mount and made of aluminium plated with gold and plated by kanigen process). Further, heater 38 made of silicon rubber is located under cooling jacket 36 (Japanese Patent Application Sho 62-60581).

The surface of each of mounts 14a can be heated to predetermined temperature by the temperature raising and lowering means housed in each of the mounts 14a. The surface temperature of mount 14a is transmitted to wafer 34, which is thus heated to its predetermined temperature. This wafer 34 is contacted with probe needles of probe card and thus examined.

The temperature of mount 14a at the first measuring section of the probe apparatus is set to 80° C., for example, which is the highest to allow the quality of semiconductor chips to be guaranteed. The temperature of mount 14a at second measure section of the probe apparatus is set −5° C. which is the lowest to allow the quality of semiconductor chips to be guaranteed. After it is pre-aligned, wafer 34 is placed on mount 14a and measurement is made of wafer 34, which is heated to 80° C., contacting it with probe needles. It is then unloaded onto seat 9 by arm 26 and further loaded onto mount 14a at second measuring section 3 by means of arm 27 at loader section 1. Wafer 34 which is cooled to −5° C. is then measured. Wafer 34 which has been measured on both mounts 14a of different temperatures are unloaded into cassette 5a. In the case of this manner, wafer 34 is carried from mount 14a of a predetermined temperature to mount 14a of another predetermined temperature by means of the system at loader section. When wafer 34 is to be continuously measured relating to two kinds of temperature, therefore, its measuring efficiency can be made remarkably high.

The object to be measured is carried through plural mounts of different temperatures and the object heated to predetermined temperatures by respective mounts are measured. Therefore, the object can be measured under plural different temperatures during one time carrying process. In addition, temperature can be changed variously.

The probe apparatus used in the above-described embodiments comprises a box of loader section and two independent boxes of measuring sections, but the same measurement can be made even when the probe apparatus comprising a box in which a loader section and a measuring section are incorporated is combined with an independent box of measuring section.

In the case of the above-described embodiments, measuring sections are arranged on both sides, right and left, of a loader section. Namely, they are in this order of (measure section)—(loader section)—(measure section). However, this arrangement of measuring and loader sections can be changed depending upon how the object to be measured is integrated and how quickly it is needed. A plurality of loader sections may be arranged between two measuring sections or two measuring sections may be arranged on both sides, right and left, of a loader section in this order of (measuring section)—(measuring section)—(loader section)—(measuring section) —(measuring section).

When these sections are arranged as described above, wafer 34 may be carried to these sections by means of the vacuum suction arm at the loader section and other vacuum suction arms which are provided as auxiliary members at the measuring sections.

Although the power source portion has been located in the loader section, it may be formed as an independent power source section outside the loader section box. When current is supplied from this independent power source section to plural loader and measuring sections, the loader and measuring sections can be small-sized and the cost can be reduced.

What is claimed is:

1. A probing test apparatus for highly integrated IC chips formed on a semiconductor wafer, in which each of the pads of said IC chips is in contact with a probe in 1:1 relationship, and while the electrical characteristics of each IC chip are being tested in a first testing section, loading/unloading of another wafer is carried out between a second testing section and a loader section, said apparatus comprising:
   at least said first and second testing sections each having a first system for electrically testing wafers and an independent member for supporting said system;
   said loader section having a second system for carrying the wafers to the testing sections and a supporting member for supporting said second system;
   means provided in at least one of the independent members and serving to store those results of electrically testing the wafers at each of the testing sections; and
   marking means arranged on at least one of the independent members and made independent of the testing sections;
   wherein said at least first and second testing sections and said loader section are arranged independent of each other such that they are physically separate, not mechanically linked, spaced apart from each other, and vibration is not transmitted from any one section to any other section.

2. The probe apparatus according to claim 1, wherein said second system has a system for carrying an object to be tested to the first testing section and then a next object to the second testing section.

3. The probe apparatus according to claim 1, wherein at least one of said independent members supports a system therein for making a next object ready to be carried while the previous object is being tests.

4. The probe apparatus according to claim 1, wherein said loader section has a power source portion for driving the second system for carrying the objects to be tested and supplying a current to enable the testing sections in he independent members to electrically test the objects.

5. The probe apparatus according to claim 1, wherein each of said testing sections has a mount on which the object to be tested is placed, and a means housed in the mount for raising and lowering the temperature of the mount.

6. The probe apparatus according to claim 1, wherein said marking means has an ink container and an ink push-out rod passing through the ink container with at least one end of the push-out rod located outside the ink container, said ink container having at one end thereof an ink push-out hole through which an opposite end of the ink push-out rod passes and a sleeve-like ink push-out portion continuous from the hole, an said ink push-out rod having an electromagnetic coil wound round its end located outside the ink container operating such that the amount of ink pushed out and the number of times of pushing out are controlled by applying electric power to the coil.

7. A probing test apparatus for highly integrated IC chips formed on a semiconductor wafer, in which each of the pads of said IC chips is in contact with a probe in 1:1 relationship, and while the electrical characteristics of each IC chip are being tested in a first testing section, loading/unloading of another wafer is carried out between a second testing section and a loader section, said apparatus comprising:
   a means for including an independent box for housing each of said testing sections provided with a system to electrically test wafers and a loader section provided with a system to carry the wafers to the testing section; and
   at least one of said testing sections capable of being combined with said means and housed in said independent box, wherein said at least one testing section is independent of said loader section and is independent of any other one of said at least one testing section in order that they are physically separate, not mechanically linked, spaced apart from each other, and vibration is not transmitted from any one section to any other section.

8. A probing test apparatus for highly integrated IC chips formed on a semiconductor wafer, in which each of the pads of said IC chips is in contact with a probe in 1:1 relationship, and while the electrical characteristics of each IC chip are being tested in a first testing section, loading/unloading of another wafer is carried out between the second testing section and a loader section, said apparatus comprising:

- at least one means including an independent member for supporting at least one of said first and second testing sections provided with a first system to electrically test wafers;
- a loader section having a second system for carrying the wafers to the testing sections and a supporting member for supporting said second system;
- a marking means including an independent member for supporting a marking section; and
- a means provided in at least one of the independent members and serving to store results of electrically testing the wafers at the testing sections, the marking section including a system to mark the wafers on a basis of the stored data gained in the testing sections, wherein said loader section and said at least one means are independent of each other to ensure that they are physically separate, not mechanically linked, spaced apart from each other, and vibration is not transmitted between said loader section and any one of said at least one means and that there is no transmission or vibration between one of said at least one means and another one of said at least one means.

* * * * *